United States Patent
Zope et al.

(10) Patent No.: US 11,908,736 B2
(45) Date of Patent: Feb. 20, 2024

(54) METHODS FOR DEPOSITING A MOLYBDENUM METAL FILM OVER A DIELECTRIC SURFACE OF A SUBSTRATE BY A CYCLICAL DEPOSITION PROCESS AND RELATED SEMICONDUCTOR DEVICE STRUCTURES

(71) Applicant: ASM IP Holding B.V., Almere (NL)

(72) Inventors: Bhushan Zope, Phoenix, AZ (US); Kiran Shrestha, Phoenix, AZ (US); Shankar Swaminathan, Phoenix, AZ (US); Chiyu Zhu, Helsinki (FI); Henri Jussila, Espoo (FI); Qi Xie, Wilsele (BE)

(73) Assignee: ASM IP Holding B.V., Almere (NL)

( * ) Notice: Subject to any disclaimer, the term of this patent is extended or adjusted under 35 U.S.C. 154(b) by 97 days.

(21) Appl. No.: 17/700,635

(22) Filed: Mar. 22, 2022

(65) Prior Publication Data
US 2022/0216105 A1 Jul. 7, 2022

Related U.S. Application Data

(60) Division of application No. 16/105,802, filed on Aug. 20, 2018, now Pat. No. 11,295,980, which is a (Continued)

(51) Int. Cl.
*H01L 21/768* (2006.01)
*H01L 21/285* (2006.01)
(Continued)

(52) U.S. Cl.
CPC .... *H01L 21/76876* (2013.01); *C23C 16/0272* (2013.01); *C23C 16/045* (2013.01);
(Continued)

(58) Field of Classification Search
CPC ......... H01L 21/76876; H01L 21/02205; C23C 16/0272; C23C 16/14
See application file for complete search history.

(56) References Cited

U.S. PATENT DOCUMENTS

2003/0165615 A1  9/2003  Aaltonen et al.
2013/0234148 A1  9/2013  Werkhoven
(Continued)

FOREIGN PATENT DOCUMENTS

| JP | H02170536 A | 7/1990 |
| KR | 20000059312 A | 10/2000 |
| KR | 20080114228 A | 12/2008 |

*Primary Examiner* — Marvin Payen
(74) *Attorney, Agent, or Firm* — Snell & Wilmer L.L.P.

(57) ABSTRACT

Methods for depositing a molybdenum metal film over a dielectric surface of a substrate by a cyclical deposition process are disclosed. The methods may include: providing a substrate comprising a dielectric surface into a reaction chamber; depositing a nucleation film directly on the dielectric surface; and depositing a molybdenum metal film directly on the nucleation film, wherein depositing the molybdenum metal film includes: contacting the substrate with a first vapor phase reactant comprising a molybdenum halide precursor; and contacting the substrate with a second vapor phase reactant comprising a reducing agent precursor. Semiconductor device structures including a molybdenum metal film disposed over a surface of a dielectric material with an intermediate nucleation film are also disclosed.

17 Claims, 6 Drawing Sheets

Related U.S. Application Data continuation-in-part of application No. 15/691,241, filed on Aug. 30, 2017, now Pat. No. 11,056,344.

(60) Provisional application No. 62/619,579, filed on Jan. 19, 2018, provisional application No. 62/607,070, filed on Dec. 18, 2017.

(51) Int. Cl.
| | | |
|---|---|---|
| *C23C 16/14* | (2006.01) | |
| *C23C 16/02* | (2006.01) | |
| *H01L 23/532* | (2006.01) | |
| *C23C 16/04* | (2006.01) | |
| *C23C 16/455* | (2006.01) | |

(52) U.S. Cl.
CPC ........ *C23C 16/14* (2013.01); *C23C 16/45525* (2013.01); *H01L 21/28568* (2013.01); *H01L 21/76877* (2013.01); *H01L 23/53266* (2013.01)

(56) References Cited

U.S. PATENT DOCUMENTS

| | | |
|---|---|---|
| 2016/0049373 A1 | 2/2016 | Peng et al. |
| 2016/0126104 A1 | 5/2016 | Shaviv et al. |
| 2016/0372365 A1 | 12/2016 | Tang et al. |
| 2017/0062224 A1 | 3/2017 | Fu et al. |
| 2018/0019165 A1 | 1/2018 | Baum et al. |
| 2018/0312966 A1 | 11/2018 | Chan et al. | ns
METHODS FOR DEPOSITING A MOLYBDENUM METAL FILM OVER A DIELECTRIC SURFACE OF A SUBSTRATE BY A CYCLICAL DEPOSITION PROCESS AND RELATED SEMICONDUCTOR DEVICE STRUCTURES

CROSS-REFERENCE TO RELATED APPLICATION

This application is a divisional of, and claims priority to and the benefit of, U.S. Non-Provisional application Ser. No. 16/105,802, filed Aug. 20, 2018 and entitled "METHODS FOR DEPOSITING A MOLYBDENUM METAL FILM OVER A DIELECTRIC SURFACE OF A SUBSTRATE BY A CYCLICAL DEPOSITION PROCESS AND RELATED SEMICONDUCTOR DEVICE STRUCTURES," which is a continuation-in-part of U.S. Non-Provisional patent application Ser. No. 15/691,241, filed on Aug. 30, 2017 and entitled "LAYER FORMING METHOD," now U.S. Pat. No. 11,056,344 issued on Jul. 6, 2021, and also priority to and the benefit of U.S. Provisional Patent Application No. 62/607,070, filed on Dec. 18, 2017 and entitled "LAYER FORMING METHOD" and U.S. Provisional Patent Application No. 62/619,579, filed on Jan. 19, 2018 and entitled "DEPOSITION METHOD."

FIELD OF INVENTION

The present disclosure relates generally to methods for depositing a molybdenum metal film over a dielectric surface of a substrate and particular methods for depositing a nucleation film directly on a dielectric surface and depositing a molybdenum metal film directly on the nucleation film. The present disclosure also general relates to semiconductor device structures including a molybdenum metal film disposed directly on a nucleation film disposed directly on the surface of a dielectric material.

BACKGROUND OF THE DISCLOSURE

Semiconductor device fabrication processes in advanced technology nodes generally require state of the art deposition methods for forming metal films, such as, for example, tungsten metal films and copper metal films.

A common requisite for the deposition of a metal film is that the deposition process is extremely conformal. For example, conformal deposition is often required in order to uniformly deposit a metal film over three-dimensional structures including high aspect ratio features. Another common requirement for the deposition of metal films is that the deposition process is capable of depositing ultra-thin films which are continuous over a large substrate area. In the particular case wherein the metal film is electrically conductive, the deposition process may need to be optimized to produce low electrical resistivity films.

Low electrical resistivity metal films commonly utilized in state of the art semiconductor device applications may include tungsten (W) and/or copper (Cu). However, tungsten metal films and copper metal films commonly require a thick barrier layer, disposed between the metal film and a dielectric material. The thick barrier layer may be utilized to prevent diffusion of metal species into the underlying dielectric material thereby improving device reliability and device yield. However, the thick barrier layer commonly exhibits a high electrical resistivity and therefore results in an increase in the overall electrical resistivity of the semiconductor device structure.

Cyclical deposition processes, such as, for example, atomic layer deposition (ALD) and cyclical chemical vapor deposition (CCVD), sequential introduce one or more precursors (reactants) into a reaction chamber wherein the precursors react with the surface of the substrate one at a time in a sequential manner. Cyclical deposition processes have been demonstrated which produce metal films with excellent conformality with atomic level thickness control.

Accordingly, methods and related device structures are desirable for depositing and utilizing low electrical resistivity metal films which are deposited by a conformal cyclical deposition process over a dielectric material.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, methods for depositing a molybdenum metal film over a dielectric surface of substrate by a cyclical deposition process are provided. The methods may comprise: providing a substrate comprising a dielectric surface into a reaction chamber; depositing a nucleation film directly on the dielectric surface; and depositing a molybdenum metal film directly on the nucleation layer, wherein depositing the molybdenum metal film comprises: contacting the substrate with a first vapor phase reactant comprising a molybdenum halide precursor; and contacting the substrate with a second vapor phase reactant comprising a reducing agent precursor.

In some embodiments, semiconductor device structures are provided. The semiconductor device structures may comprise: a substrate comprising a dielectric surface; a nucleation film disposed directly on the dielectric surface; and a molybdenum metal film disposed directly on the nucleation film.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

Figure 4A:
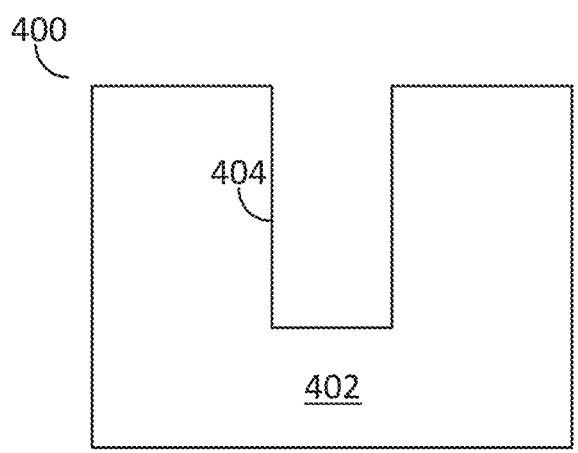
Figure 4B:
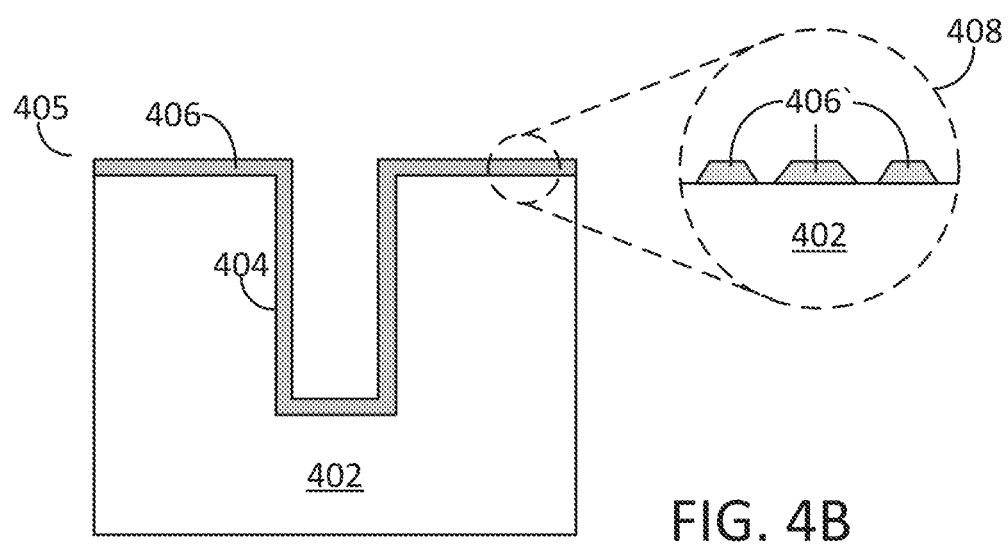
Figure 4C:
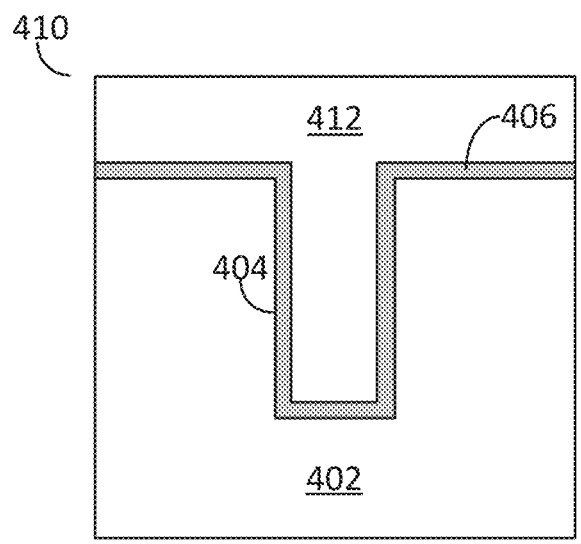
Figure 5A:
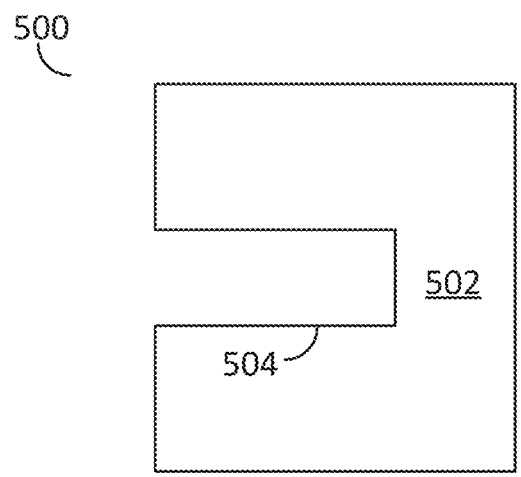
Figure 5B:
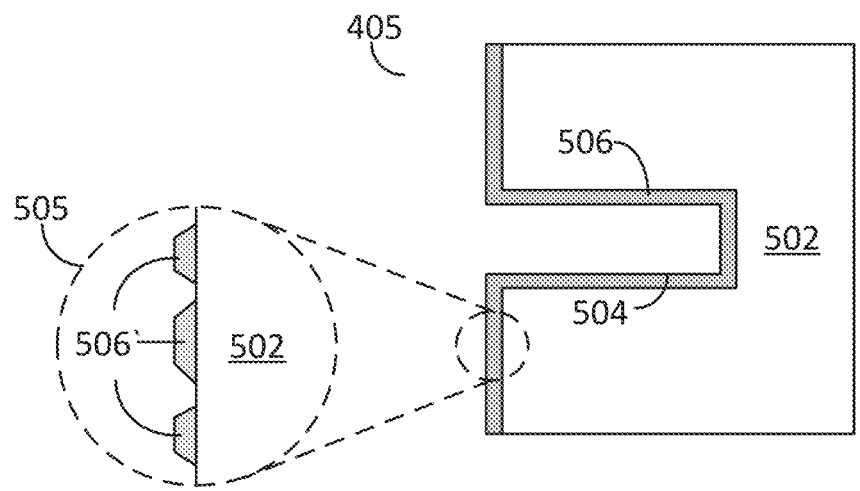
Figure 5C:
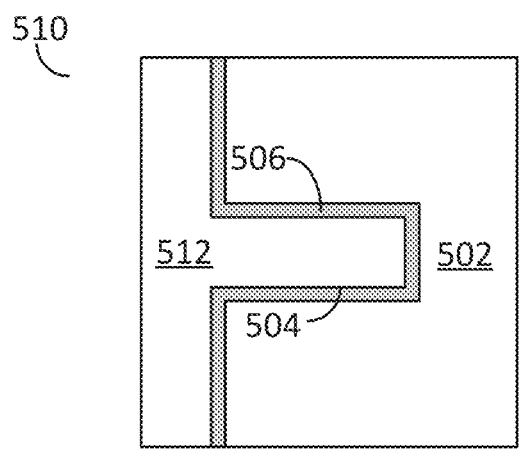
Figure 6:
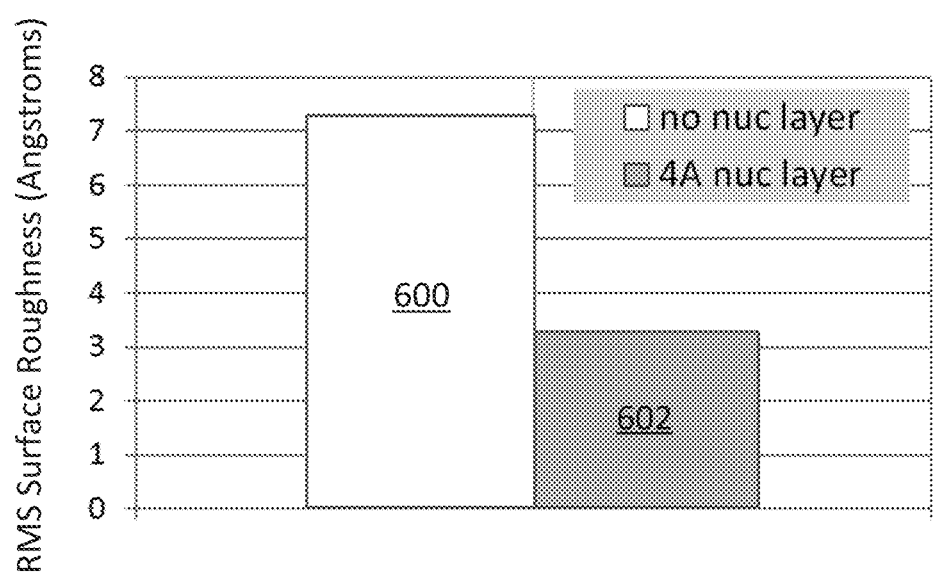

FIGS. 4A, 4B and 4C illustrate cross-sectional schematic diagrams of semiconductor device structures formed during the process of depositing a nucleation film directly on a dielectric surface comprising a vertical gap feature and subsequently depositing a molybdenum metal film directly on the nucleation film according the embodiments of the disclosure; and FIGS. 5A, 5B and 5C illustrate cross-sectional schematic diagrams of semiconductor device structures formed during the process of depositing a nucleation film directly on a dielectric surface comprising a horizontal gap feature and subsequently depositing a molybdenum metal film directly on the nucleation film according to the embodiments of the disclosure; and FIG. 6 illustrates the r.m.s. surface roughness ($R_a$) for a molybdenum metal film deposited directly on a dielectric surface and a molybdenum metal film deposited over a dielectric surface utilizing an intermediate nucleation film according to the embodiments of the disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The illustrations presented herein are not meant to be actual views of any particular material, structure, or device, but are merely idealized representations that are used to describe embodiments of the disclosure.

As used herein, the term "substrate" may refer to any underlying material or materials that may be used, or upon which, a device, a circuit, or a film may be formed.

As used herein, the term "cyclic deposition" may refer to the sequential introduction of one or more precursors (reactants) into a reaction chamber to deposit a film over a substrate and includes deposition techniques such as atomic layer deposition and cyclical chemical vapor deposition.

As used herein, the term "cyclical chemical vapor deposition" may refer to any process wherein a substrate is sequentially exposed to one or more volatile precursors, which react and/or decompose on a substrate to produce a desired deposition.

As used herein, the term "atomic layer deposition" (ALD) may refer to a vapor deposition process in which deposition cycles, preferably a plurality of consecutive deposition cycles, are conducted in a reaction chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition," "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "film" and "thin film" may refer to any continuous or non-continuous structures and material formed by the methods disclosed herein. For example, "film" and "thin film" could include 2D materials, nanolaminates, nanorods, nanotubes, or nanoparticles, or even partial or full molecular layers, or partial or full atomic layers or clusters of atoms and/or molecules. "Film" and "thin film" may comprise material or a layer with pinholes, but still be at least partially continuous.

As used herein, the term "compound material" may refer to a material comprising two or more different elementals chemically united.

As used herein, the term "binary compound material" may refer to a material consisting essentially of two different elements. Although the term "binary compound material" may refer to a material consisting essentially of two different elementals it should be noted that the binary compound material may also comprise trace quantities of impurity elements.

As used herein, the term "silicon binary compound material" may refer to a material consisting essentially of silicon atoms and an additional different elemental. Although the term "silicon binary compound material" may refer to a material consisting essentially of silicon atoms and an additional different elemental it should be noted that the silicon binary compound material may also comprise trace quantities of impurity elements.

As used herein, the term "molybdenum binary compound material" may refer to a material consisting essentially of molybdenum atoms and an additional different elemental. Although the term "molybdenum binary compound material" may refer to a material consisting essentially of molybdenum atoms and an additional different elemental it should be noted that the molybdenum binary compound material may also comprise trace quantities of impurity elements.

As used herein, the term "molybdenum halide precursor" may refer to a reactant which comprises at least a molybdenum component and a halide component, wherein the halide component may include one or more of a chlorine component, an iodine component, or a bromine component.

As used herein, the term "molybdenum chalcogenide halide" may refer to a reactant which comprises at least a molybdenum component, a halide component, and a chalcogen component, wherein a chalcogen is an element from group IV of the periodic table including oxygen (O), sulphur (S), selenium (Se), and tellurium (Te).

As used herein, the term "molybdenum oxyhalide" may refer to a reactant which comprises at least a molybdenum component, an oxygen component, and a halide component.

As used herein, the term "reducing agent precursor" may refer to a reactant that donates an electron to another species in a redox chemical reaction.

As used herein, the term "crystalline film" may refer to a film which displays at least short range ordering or even long range ordering of the crystalline structure and includes single crystalline films as well as polycrystalline films.

As used herein, the term "gap feature" may refer to an opening or cavity disposed between two surfaces of a non-planar surface. The term "gap feature" may refer to an opening or cavity disposed between opposing inclined sidewalls of two protrusions extending vertically from the surface of the substrate or opposing inclined sidewalls of an indentation extending vertically into the surface of the substrate, such a gap feature may be referred to as a "vertical gap feature." The term "gap feature" may also refer to an opening or cavity disposed between two opposing substantially horizontal surfaces, the horizontal surfaces bounding the horizontal opening or cavity; such a gap feature may be referred to as a "horizontal gap feature."

As used herein, the term "seam" may refer to a line or one or more voids formed by the abutment of edges formed in a gap fill metal, and the "seam" can be confirmed using a scanning transmission electron microscopy (STEM) or transmission electron microscopy (TEM) wherein if observations reveals a clear vertical line or one or more vertical voids in a vertical gap fill metal, or a clear horizontal line or one or more horizontal voids in a horizontal gap fill metal then a "seam" is present.

A number of example materials are given throughout the embodiments of the current disclosure, it should be noted that the chemical formulas given for each of the example materials should not be construed as limiting and that the non-limiting example materials given should not be limited by a given example stoichiometry.

The present disclosure includes methods for depositing a molybdenum metal film over a surface of a dielectric material utilizing an intermediate nucleation film which is disposed directly on the surface of the dielectric material. Molybdenum metal thin films may be utilized in a number of applications, such as, for example, low electrical resistivity gap-fill, liner layers for 3D-NAND, DRAM word-line features, or as an interconnect material in CMOS logic applications. The ability to deposit a molybdenum metal film over a dielectric surface utilizing an intermediate nucleation film, i.e., without the use of a high electrical resistivity liner layer, may allow for lower effective electrical resistivity for interconnects in logic applications, i.e., CMOS structures, and word-line/bit-line in memory applications, such as 3D-NAND and DRAM structures.

Therefore, the embodiments of the disclosure may include methods for depositing a molybdenum metal film over a dielectric surface of a substrate utilizing an intermediate nucleation film. The methods may comprise: providing a substrate comprising a dielectric surface into a reaction chamber; depositing a nucleation film directly on the dielectric surface; and depositing a molybdenum metal film directly on the nucleation film; wherein depositing the molybdenum metal film comprises: contacting the substrate with a first vapor phase reactant comprising a molybdenum halide precursor; and contacting the substrate with a second vapor phase reactant comprising a reducing agent precursor.

An exemplary process 100 for depositing a molybdenum metal film over a dielectric surface utilizing an intermediate nucleation film is illustrated with reference to FIG. 1. The exemplary process 100 may comprise two deposition processes, a first deposition process for depositing the nucleation film directly on the surface of a dielectric material, and a second deposition process for depositing the molybdenum metal film directly on the nucleation film.

Figure 1:
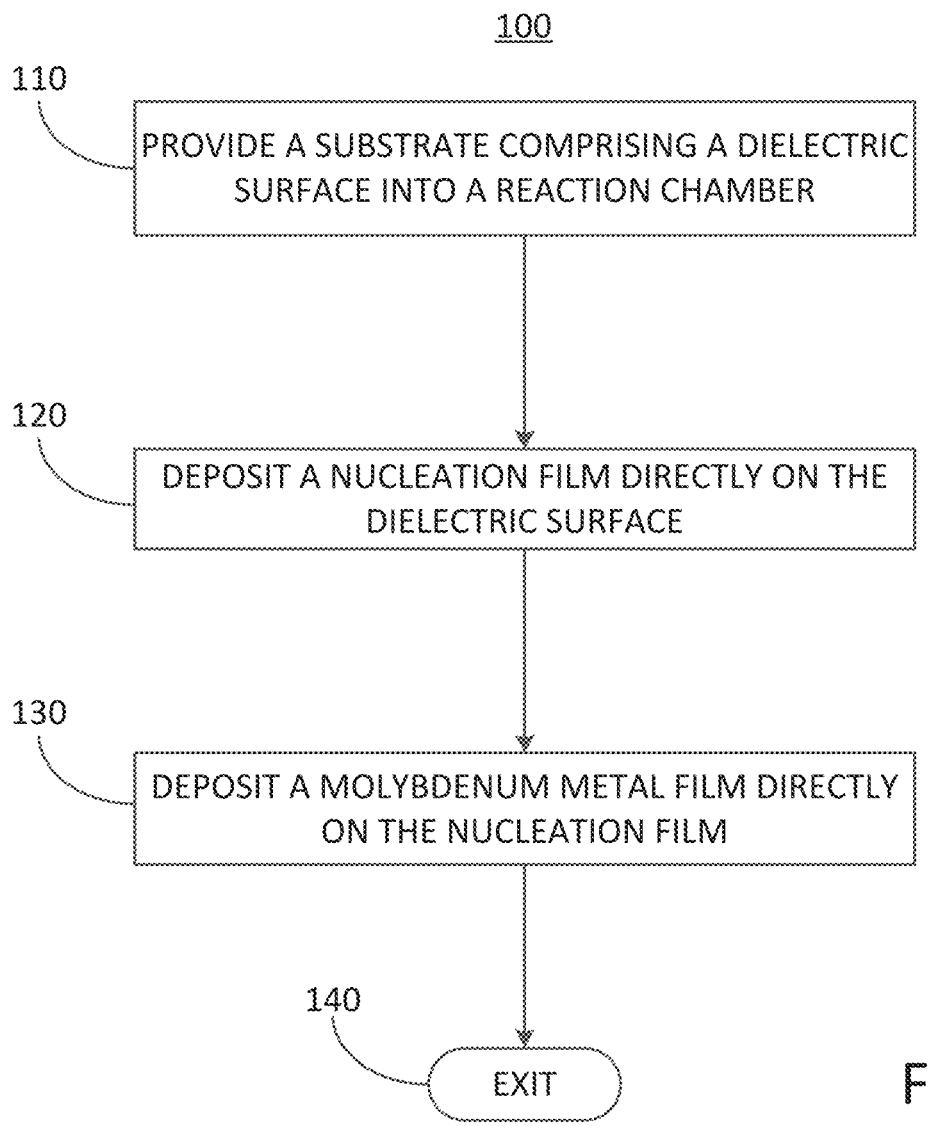
FIG. 1 illustrates a non-limiting exemplary process flow, demonstrating a method for depositing a nucleation film directly on a dielectric surface and subsequently depositing a molybdenum metal film directly on the nucleation film according to the embodiments of the disclosure.

In more detail and with reference to FIG. 1, the exemplary process 100 may commence by means of a process block 110 which comprises providing a substrate comprising a dielectric surface into a reaction chamber.

In some embodiments of the disclosure, the substrate may comprise a patterned substrate including high aspect ratio features, such as, for example, trench structures, horizontal gaps, and/or fin structures. For example, the substrate may comprise one or more substantially vertical gap features and/or one or more substantially horizontal gap features. The term "gap feature" may refer to an opening or cavity disposed between opposing inclined sidewalls of two protrusions extending vertically from the surface of the substrate or opposing inclined sidewalls of an indentation extending vertically into the surface of the substrate, such a gap feature may be referred to as a "vertical gap feature." The term "gap feature" may also refer to an opening or cavity disposed between two opposing substantially horizontal surfaces, the horizontal surfaces bounding the horizontal opening or cavity; such a gap feature may be referred to as a "horizontal gap feature." It should be noted that the embodiments of the disclosure are not limited to filling vertical gap features and/or horizontal gap features and that other geometries of gap features disposed in and/or on a substrate may be filled with a molybdenum metal by the processes disclosed herein.

In some embodiments of the disclosure, the substrate may comprise one or more substantially vertical gap features as illustrated in FIG. 4A which demonstrates semiconductor device structure 400 including substrate 402 comprising a dielectric material with a high aspect ratio vertical gap feature 404 disposed in the substrate 402. In some embodiments, the one or more vertical gap features may have an aspect ratio (height:width) which may be greater than 2:1, or greater than 5:1, or greater than 10:1, or greater than 25:1, or greater than 50:1, or even greater than 100:1, wherein "greater than" as used in this example refers to a greater distance in the height of the gap feature.

In some embodiments of the disclosure, the substrate may comprise one or more substantially horizontal gap features as illustrated in FIG. 5A which demonstrates semiconductor device structure 500 including substrate 502 comprising a dielectric material with a high aspect ratio horizontal gap feature 504 disposed in the substrate 502. In some embodiments, the one or more horizontal gap features may have an aspect ratio (height:width) which may be greater than 1:2, or greater than 1:5, or greater than 1:10, or greater than 1:25, or greater than 1:50, or even greater than 1:100, wherein "greater than" as used in this example refers to a greater distance in the width of the gap feature.

The substrate may comprise one or more materials and material surfaces including, but not limited to, semiconductor materials, dielectric materials, and metallic materials.

In some embodiments, the substrate may include semiconductor materials, such as, but not limited to, silicon (Si), germanium (Ge), germanium tin (GeSn), silicon germanium (SiGe), silicon germanium tin (SiGeSn), silicon carbide (SiC), or a group III-V semiconductor materials.

In some embodiments, the substrate may include metallic materials, such as, but not limited to, pure metals, metal nitrides, metal carbides, metal borides, and mixtures thereof.

In some embodiments, the substrate may include dielectric materials, such as, but not limited, to silicon containing dielectric materials and metal oxide dielectric materials. In some embodiments, the substrate may comprise one or more dielectric surfaces comprising a silicon containing dielectric material such as, but not limited to, silicon dioxide ($SiO_2$), silicon sub-oxides, silicon nitride ($Si_3N_4$), silicon oxynitride (SiON), silicon oxycarbide (SiOC), silicon oxycarbide nitride (SiOCN), silicon carbon nitride (SiCN). In some embodiments, the substrate may comprise one or more dielectric surfaces comprising a metal oxide such as, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), hafnium silicate ($HfSiO_x$), and lanthanum oxide ($La_2O_3$).

In some embodiments of the disclosure, the substrate may comprise an engineered substrate wherein a surface semiconductor layer is disposed over a bulk support with an intervening buried oxide (BOX) disposed there between.

Patterned substrates may comprise substrates that may include semiconductor device structures formed into or onto a surface of the substrate, for example, a patterned substrate may comprise fabricated and/or partially fabricated semiconductor device structures, such as, for example, transistors and/or memory elements. In some embodiments, the substrate may contain monocrystalline surfaces and/or one or more secondary surfaces that may comprise a non-monocrystalline surface, such as a polycrystalline surface and/or an amorphous surface. Monocrystalline surfaces may comprise, for example, one or more of silicon (Si), silicon germanium (SiGe), germanium tin (GeSn), or germanium (Ge). Polycrystalline or amorphous surfaces may include dielectric materials, such as oxides, oxynitrides, oxycarbides, oxycarbide nitrides, nitrides, or mixtures thereof.

The substrate may be disposed into one or more reaction chambers configured for depositing the nucleation film directly on the surface of a dielectric material and for depositing a molybdenum metal film directly on the nucleation film. In some embodiments, the nucleation film may be deposited directly on a dielectric surface by one or more of a chemical vapor deposition (CVD) process, a soak process, a plasma-enhanced chemical vapor deposition (PECVD) process, or a physical vapor deposition (PVD) process. In particular embodiments of the disclosure, the nucleation film and the molybdenum film may both be deposited utilizing cyclical deposition processes due to the inherent conformality achievable utilizing cyclical deposition processes and the ability of cyclical deposition processes to form conformal films over non-planar substrates comprising one or more high aspect ratio features, including, but not limited to, vertical gap features and/or horizontal gap features.

Therefore, reactors or reaction chamber capable of being used to deposit a molybdenum metal film over a dielectric surface utilizing an intermediate nucleation film may be configured for performing cyclical deposition processes, such as, for example, atomic layer deposition processes or cyclical chemical vapor deposition processes. Therefore reactors or reaction chambers suitable for performing the embodiments of the disclosure may include ALD reactors, as well as CVD reactors, configured to provide the precursors. According to some embodiments, a showerhead reactor may be used. According to some embodiments, cross-flow, batch, minibatch, or spatial ALD reactors may be used.

In some embodiments of the disclosure, a batch reactor may be used. In some embodiments, a vertical batch reactor may be used. In other embodiments, a batch reactor comprises a minibatch reactor configured to accommodate 10 or fewer wafers, 8 or fewer wafers, 6 or fewer wafers, 4 or fewer wafers, or 2 or fewer wafers. In some embodiments in which a batch reactor is used, wafer-to-wafer non-uniformity is less than 3% (1 sigma), less than 2%, less than 1%, or even less than 0.5%.

The exemplary processes for depositing a molybdenum metal film fill utilizing an intermediate nucleation film as described herein may optionally be carried out in a reactor(s) or reaction chamber(s) connected to a cluster tool. In a cluster tool, because each reaction chamber is dedicated to one type of process, the temperature of the reaction chamber in each module can be kept constant, which improves the throughput compared to a reactor in which the substrate is heated up to the process temperature before each run. Additionally, in a cluster tool it is possible to reduce the time to pump the reaction chamber to the desired process pressure levels between substrates. In some embodiments of the disclosure, the exemplary processes disclosed herein may be performed in a cluster tool comprising multiple reaction chambers, wherein each individual reaction chamber may be utilized to expose the substrate to an individual precursor gas and the substrate may be transferred between different reaction chambers for exposure to multiple precursors gases, the transfer of the substrate being performed under a controlled ambient to prevent oxidation/contamination of the substrate. For example, the deposition of the nucleation film may be performed by a cyclical deposition process in a first reaction chamber associated with a cluster tool and the deposition of the molybdenum film may be performed by a cyclical deposition process in a second reaction chamber associated with the same cluster tool with the transfer between the first reaction chamber and the second reaction chamber taking place under a controlled environment to prevent contamination or degradation of the substrate and associated films. In some embodiments of the disclosure, the processes of the current disclosure may be performed in a cluster tool comprising multiple reaction chambers, wherein each individual reaction chamber may be configured to heat the substrate to a different temperature.

In some embodiments, the exemplary process of depositing a nucleation film directly on a dielectric surface and depositing a molybdenum metal film directly on the nucleation film may be performed in a single stand-alone reactor which may be equipped with a load-lock. In that case, it is not necessary to cool down the reaction chamber between each run.

Once the substrate is deposited within a suitable reaction chamber, e.g., a reaction chamber configured for cyclical deposition processes, the exemplary process 100 of FIG. 1 may proceed by means of a process block 120 comprising deposing a nucleation film directly on a dielectric surface. The process block 120 and it constituent sub-processes are described in more detail with reference to FIG. 2 which illustrates an exemplary non-limiting cyclical deposition process for depositing a nucleation film directly on a dielectric surface.

In more detail, the deposition process for depositing the nucleation film directly on the dielectric surface may proceed by means of a sub-process 210 comprising heating the substrate to a desired deposition temperature. For example, the substrate may be heated to a substrate temperature of less than approximately 800° C., or less than approximately 700° C., or less than approximately 600° C., or less than approximately 500° C., or less than approximately 400° C., or less than approximately 300° C., or even less than approximately 200° C. In some embodiments of the disclosure, the substrate temperature during the cyclical deposition process of process block 120 may be between 250° C. and 800° C., or between 300° C. and 600° C., or between 550° C. and 600° C.

In some embodiments, the deposition temperature for depositing the nucleation film may be dependent on the composition of the material being deposited. For example, in some embodiments of the disclosure, the nucleation film may comprise a compound material, i.e., a material comprising at least two different elements. In some embodiments, the compound material may comprise a binary compound material, i.e., a material consisting essentially of two different elements and trace quantities of impurity elements. In some embodiments, the compound may comprise a ternary compound material, i.e., a material consisting essentially of three different elements and trace quantities of impurity elements.

In some embodiments, the binary compound material may comprise a silicon binary compound material, wherein a silicon compound material consists essentially of silicon atoms and a different element with trace quantities of impurity elements. For example, in some embodiments, a silicon binary compound material may comprise at least of a silicon nitride (e.g., $Si_3N_4$), a silicon carbide (e.g., SiC), or a silicon oxide (e.g., $SiO_2$). In such example embodiments, the temperature of the substrate during deposition of the nucleation layer comprising a silicon binary compound material may be less than approximately 500° C., or less than approximately 400° C., or less than approximately 300° C., or less than approximately 250° C., or even less than approximately 200° C.

In some embodiments, the binary compound material may comprise a molybdenum binary compound material, wherein a molybdenum compound material consists essentially of molybdenum atoms and a different element with trace quantities of impurity elements. For example, in some embodiments, a molybdenum binary compound material may comprise at least one of a molybdenum nitride, a molybdenum carbide, a molybdenum oxide, or a molybdenum silicide. In such example embodiments, the temperature of the substrate during deposition of the nucleation film comprising a molybdenum binary compound material may be less than approximately 700° C., or less than approximately 600° C., or less than approximately 500° C., or less than approximately 400° C., or even less than approximately 300° C. In some embodiments, the deposition of the nucleation film comprising a molybdenum binary compound material may be performed at a substrate temperature between 300° C. and 600° C., or between 400° C. and 500° C.

In some embodiments of the disclosure, the nucleation film may comprise a ternary compound, such as, for example, a silicon ternary compound (e.g., SiCN, SiON), or a molybdenum ternary compound (e.g., MoON, MoSiO). In such embodiments, the temperature of substrate during the deposition of the ternary compound may less than approximately 700° C., or less than approximately 600° C., or less than approximately 500° C., or less than approximately 400° C., or even less than approximately 300° C.

In addition, to achieving a desired deposition temperature, i.e., a desired substrate temperature, the exemplary atomic layer deposition process for depositing a nucleation film directly on a dielectric surface (i.e., process block 120) may also regulate the pressure within the reaction chamber during the deposition to obtain desirable characteristics of the nucleation film directly on the dielectric surface. For example, in some embodiments of the disclosure, the exemplary cyclical deposition process may be performed within a reaction chamber regulated to a reaction chamber pressure of less than 300 Torr, or less than 200 Torr, or less than 100 Torr, or less than 50 Torr, or less than 25 Torr, or less than 15 Torr, or even less than 1 Torr. In some embodiments, the pressure within the reaction chamber during deposition of the nucleation film may be regulated at a pressure between 1 Torr and 300 Torr, or between 1 Torr and 50 Torr, or between 1 Torr and 15 Torr, or even equal to or greater than 30 Torr.

Once the substrate has been heated to a desired temperature and the pressure within the reaction chamber has been regulated to a desired level the exemplary process for depositing the nucleation film directly on a dielectric surface may continue by means of a cyclical deposition phase 205 which may comprise an atomic layer deposition (ALD) a or cyclical chemical vapor deposition (CCVD).

A non-limiting example embodiment of a cyclical deposition process may include atomic layer deposition (ALD), wherein ALD is based on typically self-limiting reactions, whereby sequential and alternating pulses of reactants are used to deposit about one atomic (or molecular) monolayer of material per deposition cycle. The deposition conditions and precursors are typically selected to provide self-saturating reactions, such that an absorbed layer of one reactant leaves a surface termination that is non-reactive with the gas phase reactants of the same reactants. The substrate is subsequently contacted with a different reactant that reacts with the previous termination to enable continued deposition. Thus, each cycle of alternated pulses typically leaves no more than about one monolayer of the desired material. However, as mentioned above, the skilled artisan will recognize that in one or more ALD cycles more than one monolayer of material may be deposited, for example, if some gas phase reactions occur despite the alternating nature of the process.

In an ALD-type process utilized for the formation of a nucleation film directly on a dielectric surface one deposition cycle may comprise exposing the substrate to a first vapor phase reactant, removing any unreacted first reactant and reaction byproducts from the reaction chamber, and exposing the substrate to a second vapor phase reactant, followed by a second removal step. In some embodiments of the disclosure, the first vapor phase reactant may comprise at least one of a first silicon precursor or a molybdenum precursor and the second vapor phase reactant may comprise at least one of a nitrogen precursor, a carbon precursor, an oxygen precursor, or a second silicon precursor.

Precursors may be separated by inert gases, such as argon (Ar) or nitrogen ($N_2$), to prevent gas-phase reactions between reactants and enable self-saturating surface reactions. In some embodiments, however, the substrate may be moved to separately contact a first vapor phase reactant and a second vapor phase reactant. Because the reactions self-saturate, strict temperature control of the substrates and precise dosage control of the precursors may not be required. However, the substrate temperature is preferably such that an incident gas species does not condense into monolayers nor decompose on the surface. Surplus chemicals and reaction byproducts, if any, are removed from the substrate surface, such as by purging the reaction space or by moving the substrate, before the substrate is contacted with the next reactive chemical. Undesired gaseous molecules can be effectively expelled from a reaction space with the help of an inert purging gas. A vacuum pump may be used to assist in the purging.

According to some non-limiting embodiments of the disclosure, ALD processes may be used to deposit a nucleation film directly on a dielectric material surface. In some embodiments of the disclosure, each ALD cycle may comprise two distinct deposition steps or stages. In a first stage of the deposition cycle the substrate surface on which deposition is desired may be contacted with a first vapor phase reactant comprising at least one of first silicon precursor or a molybdenum precursor which chemisorbs on to the surface of the substrate, forming no more than about one monolayer of reactant species on the surface of the substrate. In a second stage of the deposition the substrate surface on which deposition is desired may be contacted with a second vapor phase reactant comprising at least one of a nitrogen precursor, a carbon precursor, an oxygen precursor, or a second silicon precursor.

Upon heating the substrate to a desired deposition temperature and regulating the pressure within the reaction chamber, the exemplary atomic layer deposition process 120 may continue with a cyclical deposition phase 205 by means of a process block 220, which comprises contacting the substrate with a first vapor phase reactant and particularly, in some embodiments, contacting the substrate with a first vapor phase reactant comprising at least one of a first silicon precursor or a molybdenum halide precursor.

In some embodiments, the nucleation film may comprise a silicon binary compound and in such embodiments the first vapor phase reactant may comprise a first silicon precursor. In some embodiments, the first silicon precursor may comprise at least one of silanediamine N,N,N',N-tetraethyl ($C_8H_{22}N_2Si$), BTBAS (bis(tertiarybutylamino)silane), BDEAS (bis(diethylamino)silane), TDMAS (tris(dimethylamino)silane), hexakis(ethylamino)disilane ($Si_2(NHC_2H_5)_6$), silicon tetraiodide ($SiI_4$), silicon tetrachloride ($SiCl_4$), hexachlorodisilane (HCDS), or pentachlorodisilane(PCDS). In some embodiments, the first silicon precursor may comprise a silane, such as, for example, silane ($SiH_4$), disilane ($Si_2H_6$), trisilane ($Si_3H_8$), tetrasilane ($Si_4H_{10}$) or higher order silanes with the general empirical formula $Si_xH_{(2x+2)}$.

In some embodiments, the nucleation film may comprise a molybdenum binary compound and in such embodiments the first vapor phase reactant may comprise a molybdenum halide precursor. In some embodiments, the molybdenum halide precursor may comprise a molybdenum chloride precursor, a molybdenum iodide precursor, or a molybdenum bromide precursor. For example, as a non-limiting example, the first vapor phase reactant may comprise a molybdenum chloride, such as, for example, molybdenum pentachloride ($MoCl_5$).

In some embodiments, the molybdenum halide precursor may comprise a molybdenum chalcogenide and in particular embodiments the molybdenum halide precursor may comprise a molybdenum chalcogenide halide. For example, the molybdenum chalcogenide halide precursor may comprise a molybdenum oxyhalide selected from the group comprising: a molybdenum oxychloride, a molybdenum oxyiodide, or a molybdenum oxybromide. In particular embodiments of the disclosure, the molybdenum precursor may comprise a molybdenum oxychloride, including, but not limited to, molybdenum (IV) dichloride dioxide ($MoO_2Cl_2$).

In some embodiments of the disclosure, contacting the substrate with a first vapor phase reactant comprising at least a first silicon precursor or a molybdenum precursor may comprise contacting the first vapor phase reactant to the substrate for a time period of between about 0.1 seconds and about 60 seconds, between about 0.1 seconds and about 10 seconds, or between about 0.5 seconds and about 5.0 seconds. In addition, during the contacting of the substrate with the first vapor phase reactant, the flow rate of the precursor may be less than 1000 sccm, or less than 500 sccm, or less than 100 sccm, or less than 10 sccm, or even less than 1 sccm. In addition, during the contacting of substrate with the first vapor phase reactant the flow rate of the precursor may range from about 1 to 2000 sccm, from about 5 to 1000 sccm, or from about 10 to about 500 sccm.

Figure 2:
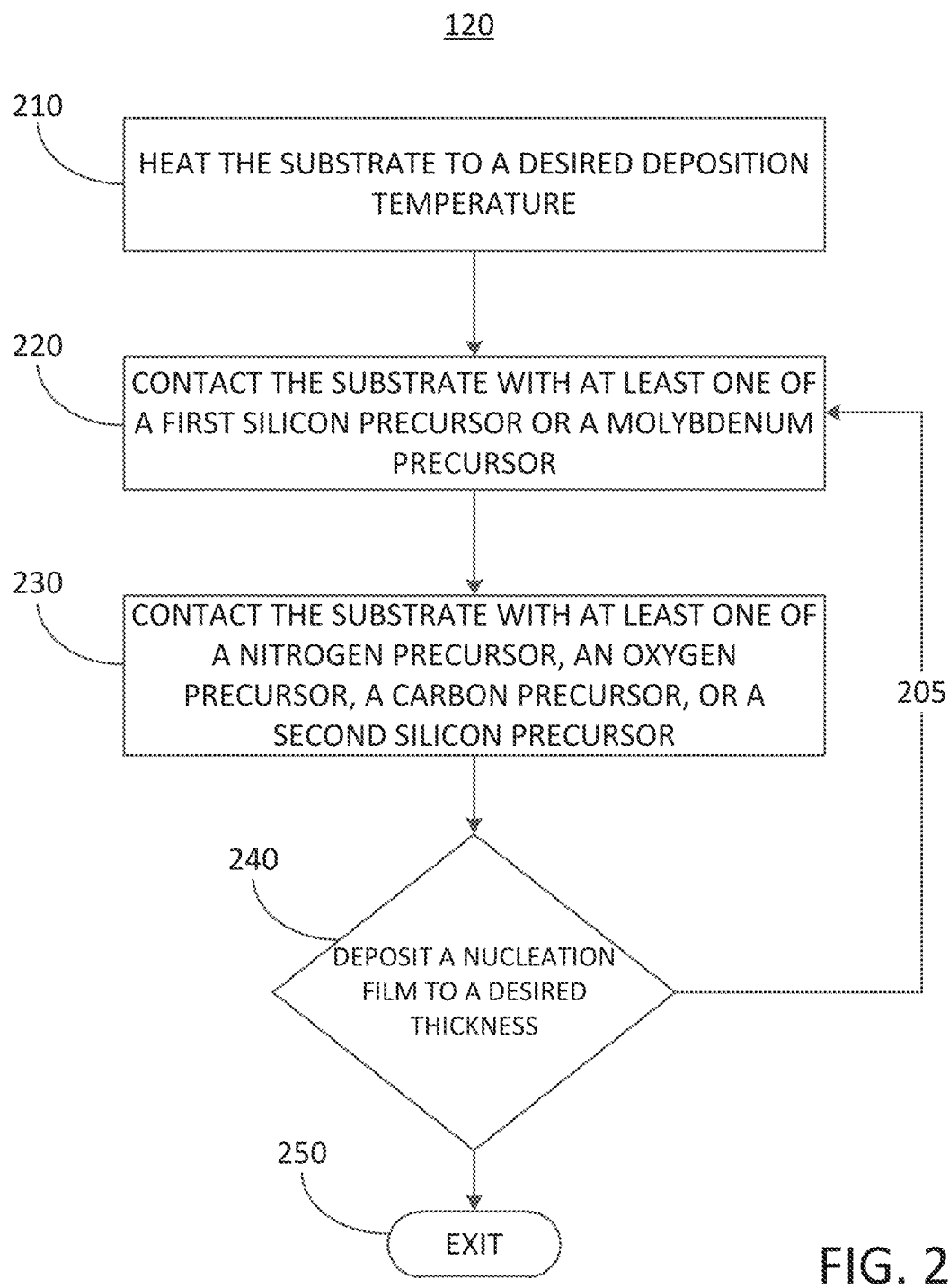
FIG. 2 illustrates a non-limiting exemplary process flow, demonstrating a cyclical deposition process for depositing a nucleation film directly on a dielectric surface according to the embodiments of the disclosure.

The exemplary atomic layer deposition process for deposition a nucleation film directly on a dielectric surface as illustrated by process block 120 of FIG. 2 may continue by purging the reaction chamber. For example, excess first vapor phase reactant and reaction byproducts (if any) may be removed from the surface of the substrate, e.g., by pumping with an inert gas. In some embodiments of the disclosure, the purge process may comprise a purge cycle wherein the substrate surface is purged for a time period of less than approximately 5.0 seconds, or less than approximately 3.0 seconds, or even less than approximately 2.0 seconds. Excess first vapor phase reactant, such as, for example, excess first silicon precursor or molybdenum precursor and any possible reaction byproducts may be removed with the aid of a vacuum, generated by a pumping system in fluid communication with the reaction chamber.

Upon purging the reaction chamber with a purge cycle the exemplary atomic layer deposition process block 120 may continue with a second stage of the cyclical deposition phase 205 by means of a process block 230 which comprises contacting the substrate with a second vapor phase reactant, and particularly contacting the substrate with a second vapor phase reactant comprising at least one of a nitrogen precursor, a carbon precursor, an oxygen precursor, or a second silicon precursor.

In some embodiments of the disclosure, the nucleation film may comprise a silicon binary compound material and in particular embodiments comprises a silicon nitride (e.g., $Si_3N_4$). In such embodiments, the first vapor phase reactant may comprise a first silicon precursor and the second vapor phase reactant may comprise a nitrogen precursor.

In some embodiments of the disclosure, the nucleation film may comprise a silicon binary compound material and in particular embodiments comprises a silicon oxide (e.g., $SiO_2$). In such embodiments, the first vapor phase reactant may comprise a first silicon precursor and the second vapor phase reactant may comprise an oxygen precursor.

In some embodiments of the disclosure, the nucleation film may comprise a silicon binary compound material and in particular embodiments comprises a silicon carbide (e.g., SiC). In such embodiments, the first vapor phase reactant may comprise a first silicon precursor and the second vapor phase reactant may comprise a carbon precursor.

In some embodiments of the disclosure, the nucleation film may comprise a molybdenum binary compound material and in particular embodiments comprises a molybdenum nitride. In such embodiments, the first vapor phase reactant may comprise a molybdenum precursor and the second vapor phase reactant may comprise a nitrogen precursor.

In some embodiments of the disclosure, the nucleation film may comprise a molybdenum binary compound material and in particular embodiments comprises a molybdenum oxide. In such embodiments, the first vapor phase reactant may comprise a molybdenum precursor and the second vapor phase reactant may comprise an oxygen precursor.

In some embodiments of the disclosure, the nucleation film may comprise a molybdenum binary compound material and in particular embodiments comprises a molybdenum silicide. In such embodiments, the first vapor phase reactant may comprise a molybdenum precursor and the second vapor phase reactant may comprise a second silicon precursor.

In some embodiments of the disclosure, the nucleation film may comprise a molybdenum binary compound material and in particular embodiments comprises a molybdenum carbide. In such embodiments, the first vapor phase reactant may comprise a molybdenum precursor and the second vapor phase reactant may comprise a carbon precursor.

In embodiments wherein the nucleation film comprises a nitride, such as, for example, a silicon nitride or a molybdenum nitride, the second vapor phase reactant may comprise a nitrogen precursor. In such embodiments of the disclosure, the nitrogen precursor may comprise at least one of ammonia ($NH_3$), hydrazine ($N_2H_4$), triazane ($N_3H_5$), tertbutylhydrazine ($C_4H_9N_2H_3$), methylhydrazine ($CH_3NHNH_2$), dimethylhydrazine (($CH_3)_2N_2H_2$), or a nitrogen plasma, wherein a nitrogen plasma includes atomic nitrogen, nitrogen radicals and excited nitrogen species.

In embodiments wherein the nucleation film comprises an oxide, such as, for example, a silicon oxide or a molybdenum oxide, the second vapor phase reactant may comprise an oxygen precursor. In such embodiments of the disclosure, the oxygen precursor comprises at least one of water ($H_2O$), hydrogen peroxide ($H_2O_2$), ozone ($O_3$), or oxides of nitrogen, such as, for example, nitrogen monoxide (NO), nitrous oxide ($N_2O$), or nitrogen dioxide ($NO_2$). In some embodiments of the disclosure, the oxygen precursor may comprise an organic alcohol, such as, for example, isopropyl alcohol. In some embodiments, the oxygen precursor may comprise an oxygen plasma, wherein an oxygen plasma comprises atomic oxygen, oxygen radicals, and excited oxygen species.

In embodiments wherein the nucleation film comprises a carbide, such as, for example, a silicon carbide or a molybdenum carbide, the second vapor phase reactant may comprise a carbon precursor. In such embodiments of the disclosure, the carbon precursor may comprise a hydrocarbon, such as, for example, linear or branched alkanes.

In embodiments wherein the nucleation film comprises a silicide, such as, for example, a molybdenum silicide, the second vapor phase reactant may comprise a second silicon precursor. In such embodiments of the disclosure, the second silicon precursor comprises at least one of silanediamine N,N,N',N-tetraethyl ($C_8H_{22}N_2Si$), BTBAS (bis(tertiarybutylamino)silane), BDEAS (bis(diethylamino)silane), TDMAS (tris(dimethylamino)silane), hexakis(ethylamino)disilane ($Si_2(NHC_2H_5)_6$), silicon tetraiodide ($SiI_4$), silicon tetrachloride ($SiCl_4$), hexachlorodisilane (HCDS), or pentachlorodisilane(PCDS). In some embodiments, the second silicon precursor may comprise a silane, such as, for example, silane ($SiH_4$), disilane ($Si_2H_6$), trisilane ($Si_3H_8$), tetrasilane ($Si_4H_{10}$) or higher order silanes with the general empirical formula $Si_xH_{(2x+2)}$.

In some embodiments of the disclosure, contacting the substrate with the second vapor phase reactant may comprise contacting the substrate with the precursor for a time period of between about 0.01 seconds and about 120 seconds, between about 0.05 seconds and about 60 seconds, or between about 0.1 seconds and about 10 seconds. In addition, during the contacting of the substrate with the second vapor phase reactant, the flow rate of the second vapor phase reactant may be less than 10000 sccm, or less than 5000× sccm, or even less than 1000×.

Upon contacting the substrate with the second vapor phase reactant comprising at least one of nitrogen precursor, a carbon precursor, an oxygen precursor, or a second silicon precursor, the exemplary process block 120 for depositing a nucleation film directly on a dielectric surface may proceed by purging the reaction chamber. For example, excess second vapor phase reactant and reaction byproducts (if any) may be removed from the surface of the substrate, e.g., by pumping whilst flowing an inert gas. In some embodiments of the disclosure, the purge process may comprise purging the substrate surface for a time period of between approximately 0.1 seconds and approximately 10 seconds, or between approximately 0.5 seconds and approximately 3 seconds, or even between approximately 1 second and 2 seconds.

Upon completion of the purge of the second vapor phase reactant and any reaction byproducts from the reaction chamber, the cyclic deposition phase 205 of exemplary atomic layer deposition of process block 120 may continue with a decision gate 240, wherein the decision gate 240 is dependent on the thickness of the nucleation film deposited. For example, if the nucleation film is deposited at an insufficient thickness for a desired device application, then the cyclical deposition phase 205 may be repeated by returning to the process block 220 and continuing through a further deposition cycle, wherein a unit deposition cycle may comprise contacting the substrate with at least a first silicon precursor or a molybdenum halide precursor (process block 220), purging the reaction chamber, contacting the substrate with at least one of a nitrogen precursor, a carbon precursor, an oxygen precursor, or a second silicon precursor (process block 230), and again purging the reaction chamber. A unit deposition cycle of cyclical deposition phase 205 may be repeated one or more times until a desired thickness of a nucleation film is deposited over the substrate and particularly directly on a dielectric surface. Once the nucleation film has been deposited to the desired thickness the exemplary atomic layer deposition process block 120 may exit via a process block 250 and the substrate comprising a dielectric surface, with the nucleation film deposited thereon, may be subjected to the further processes of exemplary process 100 of FIG. 1.

It should be appreciated that in some embodiments of the disclosure, the order of contacting of the substrate with the first vapor phase reactant (e.g., the first silicon precursor or the molybdenum precursor) and the second vapor phase reactant (e.g., the nitrogen precursor, a carbon precursor, an oxygen precursor, or a second silicon precursor) may be such that the substrate is first contacted with the second vapor phase reactant followed by the first vapor phase reactant. In addition, in some embodiments, the cyclical deposition phase 205 of exemplary process block 120 may comprise contacting the substrate with the first vapor phase reactant one or more times prior to contacting the substrate with the second vapor phase reactant one or more times. In addition, in some embodiments, the cyclical deposition phase 205 of exemplary process block 120 may comprise contacting the substrate with the second vapor phase reactant one or more times prior to contacting the substrate with the first vapor phase reactant one or more times.

In some embodiments the cyclical deposition process may be a hybrid ALD/CVD or a cyclical CVD process. For example, in some embodiments, the growth rate of the ALD process may be low compared with a CVD process. One approach to increase the growth rate may be that of operating at a higher substrate temperature than that typically employed in an ALD process, resulting in some portion of a chemical vapor deposition process, but still taking advantage of the sequential introduction of precursors, such a process may be referred to as cyclical CVD. In some embodiments, a cyclical CVD process may comprise the introduction of two or more precursors into the reaction chamber wherein there may be a time period of overlap between the two or more precursors in the reaction chamber resulting in both an ALD component of the deposition and a CVD component of the deposition. For example, a cyclical CVD process may comprise the continuous flow of a one precursor and the periodic pulsing of a second precursor into the reaction chamber.

In some embodiments of the disclosure, the nucleation film may be deposited directly on a dielectric surface at a growth rate from about 0.05 Å/cycle to about 5 Å/cycle, from about 0.1 Å/cycle to about 5 Å/cycle, or even from about 0.5 Å/cycle to about 1.5 Å/cycle.

In some embodiments of the disclosure, the nucleation film is deposited as a continuous film, see for example the semiconductor device structure 405 which includes the continuous nucleation film 406 disposed directly on a dielectric substrate 402 comprising a vertical gap feature 404, as illustrated in FIG. 4B, or see for example the semiconductor device structure 505 comprising the continuous nucleation film 506 disposed directly on a dielectric substrate 502 comprising a horizontal gap features, as illustrated in FIG. 5B. In some embodiments, the continuous nucleation film 406/506 may be deposited to a thickness of less than 20 Angstroms, or less than 10 Angstroms, or less than 5 Angstroms, or even less than 3 Angstroms.

In some embodiments of the disclosure, the nucleation film is deposited as a discontinuous film, see for example the insert of 408 of semiconductor device structure 405 which includes an example of a discontinuous nucleation film 406' disposed directly on a dielectric substrate 402 comprising a vertical gap feature 404, as illustrated in FIG. 4B, or see for example the insert 508 of semiconductor device structure 505 which include an example of a discontinuous nucleation film 506' disposed directly on a dielectric substrate 502 comprising a horizontal gap features, as illustrated in FIG. 5B. In some embodiments, the discontinuous nucleation film 406'/506' may be deposited to a thickness of less than 20 Angstroms, or less than 10 Angstroms, or less than 5 Angstroms, or even less than 3 Angstroms.

In some embodiments, the step coverage of the nucleation film over one or more dielectric gap features may be equal to or greater than about 50%, or greater than about 80%, or greater than about 90%, or greater than about 95%, or greater than about 98%, or about 99% or greater.

It should also be noted that the nucleation films of the current disclosure do not constitute a barrier layer or barrier material as commonly used in semiconductor device applications to prevent diffusion of metal species into an underlying dielectric material, the barrier layer being disposed between a metal contact and the dielectric material. The nucleation films of the current disclosure are utilized to improve the material qualities of a subsequently deposited molybdenum metal film and do not constitute the thick film, high resistivity barrier layers or barrier materials utilized in common semiconductor device fabrication processes.

Upon depositing the nucleation film directly on dielectric surface the exemplary process 100 (of FIG. 1) may continue by means of a process block 130 comprising depositing a molybdenum metal film directly on the nucleation film and in some particular embodiments depositing the molybdenum metal film directly on the nucleation film by a cyclical deposition process. The process block 130 and the related constituent sub-process blocks are described in greater detail with reference to FIG. 3, which illustrated an exemplary cyclical deposition process for depositing the molybdenum metal film.

In more detail, the exemplary cyclical deposition process may comprise an atomic layer deposition process or a cyclical chemical vapor deposition process. As a non-limiting example, the process block 130 may comprise an atomic layer deposition process and may commence by means of a sub-process block 310 comprising heating the substrate to a desired deposition temperature. For example, the substrate may be heated to a substrate temperature of less than approximately 800° C., or less than approximately 700° C., or less than approximately 600° C., or less than approximately 5500° C., or less than approximately 500° C., or less than approximately 400° C., or less than approximately 300° C., or even less than approximately 200° C. In some embodiments of the disclosure, the substrate temperature during the exemplary atomic layer deposition process block 130 may be between 200° C. and 800° C., or between 300° C. and 700° C., or between 400° C. and 600° C., or between 500° C. and 550° C.

In addition, to achieving a desired deposition temperature, i.e., a desired substrate temperature, the exemplary atomic layer deposition process 130 may also regulate the pressure within the reaction chamber during deposition to obtain desirable characteristics of the deposited molybdenum metal film. For example, in some embodiments of the disclosure, the exemplary atomic layer deposition process 130 may be performed within a reaction chamber regulated to a reaction chamber pressure of less than 300 Torr, or less than 200 Torr, or less than 100 Torr, or less than 50 Torr, or less than 25 Torr, or even less than 10 Torr. In some embodiments, the pressure within the reaction chamber during deposition may be regulated at a pressure between 10 Torr and 300 Torr, or between 30 Torr and 80 Torr, or even equal to or greater than 30 Torr.

Upon heating the substrate to a desired deposition temperature and regulating the pressure within the reaction chamber, the exemplary atomic layer deposition process 130 may continue with a cyclical deposition phase 305 by means of a process block 320, which comprises contacting the substrate with a first vapor phase reactant and particularly, in some embodiments, contacting the substrate with a first vapor phase reactant comprising a molybdenum halide precursor, i.e., the molybdenum precursor.

In some embodiments of the disclosure, the molybdenum halide precursor may comprise a molybdenum chloride precursor, a molybdenum iodide precursor, or a molybdenum bromide precursor. For example, as a non-limiting example, the first vapor phase reactant may comprise a molybdenum chloride, such as, for example, molybdenum pentachloride ($MoCl_5$).

In some embodiments, the molybdenum halide precursor may comprise a molybdenum chalcogenide and in particular embodiments the molybdenum halide precursor may comprise a molybdenum chalcogenide halide. For example, the molybdenum chalcogenide halide precursor may comprise a molybdenum oxyhalide selected from the group comprising: a molybdenum oxychloride, a molybdenum oxyiodide, or a molybdenum oxybromide. In particular embodiments of the disclosure, the molybdenum precursor may comprise a molybdenum oxychloride, including, but not limited to, molybdenum (IV) dichloride dioxide ($MoO_2Cl_2$).

In some embodiments of the disclosure, contacting the substrate with a first vapor phase reactant comprising a molybdenum halide precursor may comprise contacting the molybdenum halide precursor to the substrate for a time period of between about 0.1 seconds and about 60 seconds, between about 0.1 seconds and about 10 seconds, or between about 0.5 seconds and about 5.0 seconds. In addition, during the contacting of the substrate with the molybdenum halide precursor, the flow rate of the molybdenum halide precursor may be less than 1000 sccm, or less than 500 sccm, or less than 100 sccm, or less than 10 sccm, or even less than 1 sccm. In addition, during the contacting of substrate with the molybdenum halide precursor the flow rate of the molybdenum precursor may range from about 1 to 2000 sccm, from about 5 to 1000 sccm, or from about 10 to about 500 sccm.

Figure 3:
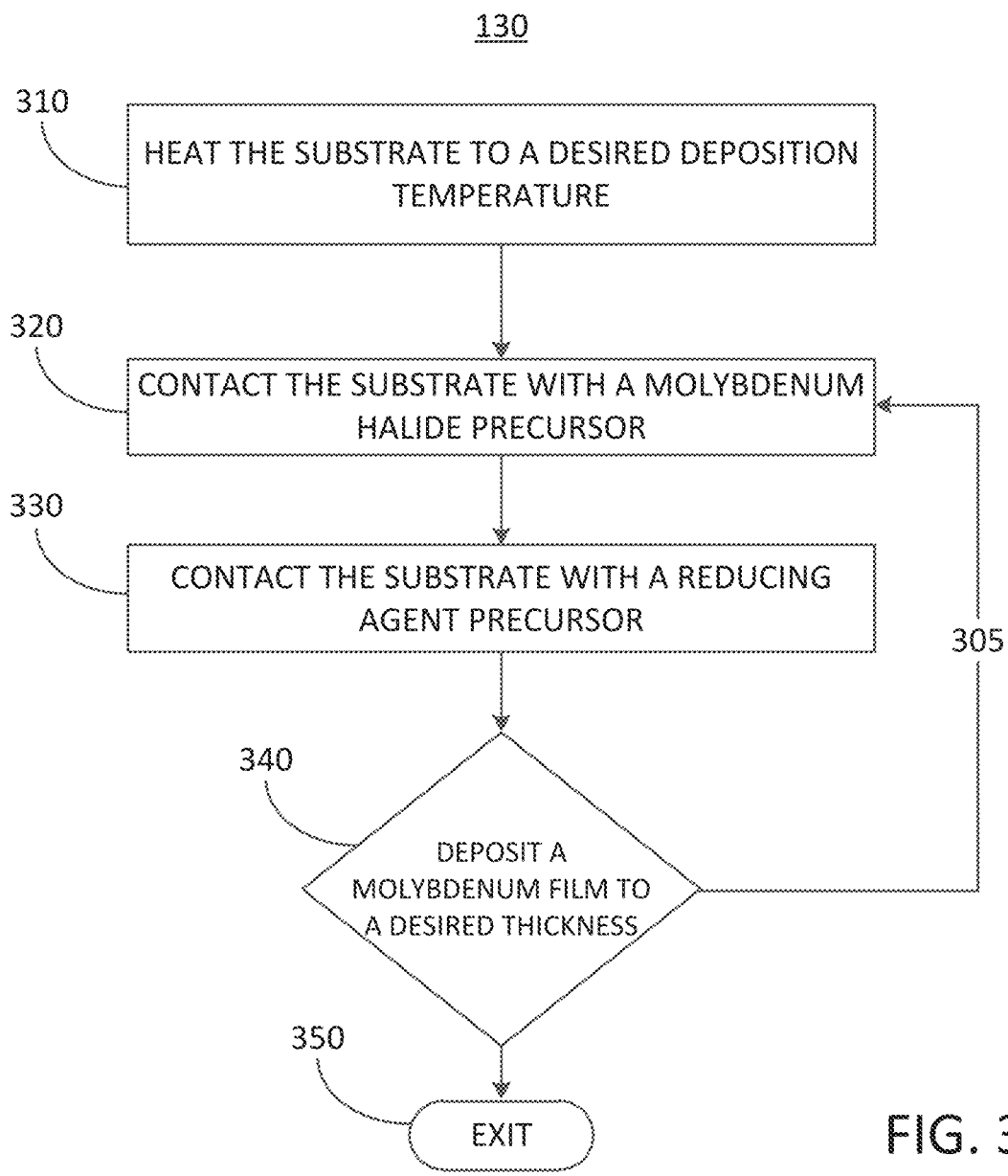
FIG. 3 illustrates a non-limiting exemplary process flow, demonstrating a cyclical deposition process for depositing a molybdenum metal film directly on a nucleation film according to the embodiments of the disclosure.

The exemplary atomic layer deposition process 130 for deposition a molybdenum metal film directly on the nucleation film as illustrated by process block 130 of FIG. 3 may continue by purging the reaction chamber. For example, excess first vapor phase reactant and reaction byproducts (if any) may be removed from the surface of the substrate, e.g., by pumping with an inert gas. In some embodiments of the disclosure, the purge process may comprise a purge cycle wherein the substrate surface is purged for a time period of less than approximately 5.0 seconds, or less than approximately 3.0 seconds, or even less than approximately 2.0 seconds. Excess first vapor phase reactant, such as, for example, excess molybdenum precursor and any possible reaction byproducts may be removed with the aid of a vacuum, generated by a pumping system in fluid communication with the reaction chamber.

Upon purging the reaction chamber with a purge cycle the exemplary atomic layer deposition process block 130 may continue with a second stage of the cyclical deposition phase 305 by means of a process block 330 which comprises contacting the substrate with a second vapor phase reactant, and particularly contacting the substrate with a second vapor phase reactant comprising a reducing agent precursor ("the reducing precursor").

In some embodiments of the disclosure, the reducing agent precursor may comprise at least one of forming gas ($H_2+N_2$), ammonia ($NH_3$), hydrazine ($N_2H_4$), an alkyl-hydrazine (e.g., tertiary butyl hydrazine ($C_4H_{12}N_2$)), molecular hydrogen ($H_2$), hydrogen atoms (H), a hydrogen plasma, hydrogen radicals, hydrogen excited species, an alcohol, an aldehyde, a carboxylic acid, a borane, or an amine. In further embodiments, the reducing agent precursor may comprise at least one of silane ($SiH_4$), disilane ($Si_2H_6$), trisilane ($Si_3H_8$), germane ($GeH_4$), digermane ($Ge_2H_6$), borane ($BH_3$), or diborane ($B_2H_6$). In particular embodiments of the disclosure, the reducing agent precursor may comprise molecular hydrogen ($H_2$).

In some embodiments of the disclosure, contacting the substrate with the reducing agent precursor may comprise contacting the substrate with the reducing agent precursor for a time period of between about 0.01 seconds and about 180 seconds, between about 0.05 seconds and about 60 seconds, or between about 0.1 seconds and about 10.0 seconds. In addition, during the contacting of the substrate with the reducing agent precursor substrate, the flow rate of the reducing agent precursor may be less than 30 slm, or less than 15 slm, or less than 10 slm, or less than 5 slm, or less than 1 slm, or even less than 0.1 slm. In addition, during the contacting of the substrate with the reducing agent precursor to the substrate the flow rate of the reducing agent precursor may range from about 0.1 to 30 slm, from about 5 to 15 slm, or equal to or greater than 10 slm.

Upon contacting the substrate with the reducing agent precursor, the exemplary process block 130 for depositing a molybdenum metal film directly on a nucleation film may proceed by purging the reaction chamber. For example, excess reducing agent precursor and reaction byproducts (if any) may be removed from the surface of the substrate, e.g., by pumping whilst flowing an inert gas. In some embodiments of the disclosure, the purge process may comprise purging the substrate surface for a time period of between approximately 0.1 seconds and approximately 10 seconds, or between approximately 0.5 seconds and approximately 3 seconds, or even between approximately 1 second and 2 seconds.

Upon completion of the purge of the second vapor phase reactant, i.e., the reducing agent precursor (and any reaction byproducts) from the reaction chamber, the cyclic deposition phase 305 of exemplary atomic layer deposition process block 130 may continue with a decision gate 340, wherein the decision gate 340 is dependent on the thickness of the molybdenum metal film deposited. For example, if the molybdenum metal film is deposited at an insufficient thickness for a desired device application, then the cyclical deposition phase 305 may be repeated by returning to the process block 320 and continuing through a further deposition cycle, wherein a unit deposition cycle may comprise contacting the substrate with a molybdenum halide precursor (process block 320), purging the reaction chamber, contacting the substrate with a reducing agent precursor (process block 330), and again purging the reaction chamber. A unit deposition cycle of cyclical deposition phase 305 may be repeated one or more times until a desired thickness of a molybdenum metal film is deposited over the substrate and particularly directly on a nucleation film. Once the molybdenum metal film has been deposited to the desired thickness the exemplary atomic layer deposition process block 130 may exit via a process block 350 and the substrate comprising a dielectric surface, with the molybdenum metal film deposited thereon, may be subjected to further processing for the formation of a device structure. For example, the exemplary process 100 of FIG. 1 may proceed with the process block 140 wherein the process exits and the substrate with the molybdenum metal film disposed thereon may be subjected to further semiconductor process to finalize the semiconductor device structure.

It should be appreciated that in some embodiments of the disclosure, the order of contacting of the substrate with the first vapor phase reactant (e.g., the molybdenum precursor) and the second vapor phase reactant (e.g., the reducing precursor) may be such that the substrate is first contacted with the second vapor phase reactant followed by the first vapor phase reactant. In addition, in some embodiments, the cyclical deposition phase 305 of exemplary process block 130 may comprise contacting the substrate with the first vapor phase reactant one or more times prior to contacting the substrate with the second vapor phase reactant one or more times. In addition, in some embodiments, the cyclical deposition phase 305 of exemplary process block 130 may comprise contacting the substrate with the second vapor phase reactant one or more times prior to contacting the substrate with the first vapor phase reactant one or more times.

In some embodiments the cyclical deposition process utilized for the deposition of the molybdenum metal film directly on a nucleation may be a hybrid ALD/CVD or a cyclical CVD process, as previously described herein.

The molybdenum metal films deposited by the methods disclosed herein may be continuous films. In some embodiments, the molybdenum metal film may be continuous at a thickness below approximately 100 Angstroms, or below approximately 60 Angstroms, or below approximately 50 Angstroms, or below approximately 40 Angstroms, or below approximately 30 Angstroms, or below approximately 20 Angstroms, or below approximately 10 Angstroms, or even below approximately 5 Angstroms. The continuity referred to herein can be physical continuity or electrical continuity. In some embodiments of the disclosure the thickness at which a material film may be physically continuous may not be the same as the thickness at which a film is electrically continuous, and vice versa.

In some embodiments of the disclosure, the molybdenum metal films formed according to the embodiments of the disclosure, may have a thickness from about 20 Angstroms to about 250 Angstroms, or about 50 Angstroms to about 200 Angstroms, or even about 100 Angstroms to about 150 Angstroms. In some embodiments, the molybdenum metal films deposited according to some of the embodiments described herein may have a thickness greater than about 20 Angstroms, or greater than about 30 Angstroms, or greater than about 40 Angstroms, or greater than about 50 Angstroms, or greater than about 60 Angstroms, or greater than about 100 Angstroms, or greater than about 250 Angstroms, or greater than about 500 Angstroms, or greater. In some embodiments the molybdenum metal films deposited according to some of the embodiments described herein may have a thickness of less than about 250 Angstroms, or less than about 100 Angstroms, or less than about 50 Angstroms, or less than about 25 Angstroms, or less than about 10 Angstroms, or even less than about 5 Angstroms. In some embodiments, the molybdenum metal film disposed over a dielectric surface utilizing an intermediate nucleation film may have a thickness between approximately 100 Angstroms and 250 Angstroms.

In some embodiments of the disclosure, the molybdenum metal film may be deposited over a dielectric surface utilizing an intermediate nucleation film such that the molybdenum metal film may comprise a crystalline film. In some embodiments, the molybdenum metal film may comprise a polycrystalline film wherein the plurality of crystalline grains comprising the polycrystalline molybdenum metal film may have a grain size greater than 100 Angstroms, or greater than 200 Angstroms, or even greater than 250 Angstroms. In some embodiments, the crystalline structure of the crystalline molybdenum metal film may comprise a body centered cubic structure.

In some embodiments of the disclosure, the molybdenum metal film may be deposited over a dielectric surface with one or more high aspect ratio features, including vertical high aspect ratio features and/or horizontal high aspect ratio features.

For example, FIG. 4C illustrates a semiconductor device structure 410 which comprises a dielectric material 402 with a vertical high aspect ratio feature 404, wherein the aspect ratio (height:width) may be greater than 2:1, or greater than 5:1, or greater than 10:1, or greater than 25:1, or greater than 50:1, or even greater than 100:1, wherein in this particular example "greater than" refer to a greater height of the gap feature. The deposition methods disclosure herein may be utilized to deposit a molybdenum metal film over the surface of the vertical high aspect ratio gap feature 404, as illustrated by a molybdenum metal film 412. In some embodiments, the step coverage of the molybdenum metal film over the vertical high aspect ratio dielectric gap feature may be equal to or greater than about 50%, or greater than about 80%, or greater than about 90%, or greater than about 95%, or greater than about 98%, or about 99% or greater.

As a non-limiting example, the semiconductor device structure 410 may represent a partially fabricated CMOS logic device wherein the dielectric material 402 may comprise an interlayer dielectric and the molybdenum metal film 412 may comprise a metal gap-fill for providing electrical connection to one or more transistor structures (not shown). As illustrated in FIG. 4A, the molybdenum metal film 406 is in direct contact with the nucleation film 404 which is in turn disposed directly on the dielectric material 402, i.e., without the need for an intermediate barrier layer material, thereby reducing the overall effective electrical resistivity of the semiconductor device structure 410.

In some embodiments, the molybdenum metal film 412 may be comprise a gap-fill metallization and the molybdenum metal film 412 may fill the gap features, i.e., the vertical high aspect ratio gap feature 404, without the formation of a seam, wherein a seam may refer to a line or one or more voids formed by the abutment of edges formed in a gap fill material, and the seam can be confirmed by using scanning transmission electron microscopy (STEM) or transmission electron microscopy (TEM), wherein if observations reveal a clear vertical line or one or more vertical voids in the gap fill material, a seam is present.

As a further non-limiting example, FIG. 5C illustrates a semiconductor device structure 510 which comprises a dielectric material 502 with one or more horizontal high aspect ratio gap features 504, wherein the aspect ratio (height:width) may be greater than 1:2, or greater than 1:5, or greater than 1:10, or greater than 1:25, or greater than 1:50, or even greater than 1:100, wherein this example the term "greater than" refers to a great width of the one or more gap features. The deposition methods disclosure herein may be utilized to deposit a molybdenum metal film 512 over the surface of the horizontal high aspect ratio gap feature 504 utilizing an intermediate nucleation film 506. In some embodiments, the step coverage of the molybdenum metal film disposed over the horizontal high aspect ratio dielectric gap feature may be equal to or greater than about 50%, or greater than about 80%, or greater than about 90%, or greater than about 95%, or greater than about 98%, or about 99% or greater.

As a non-limiting example embodiment, the semiconductor device structure 510 may represent a portion of a partially fabricated memory device wherein the dielectric material 502 may comprise an aluminum oxide ($Al_2O_3$) and the molybdenum metal film 512 may comprise at least a portion of a metal gate structure.

As with the vertical gap-fill processes, the molybdenum metal film 512 (of FIG. 5C) may be utilized as a gap-fill metallization for horizontal high aspect ratio features without the formation of a seam, as previously described.

In some embodiments of the disclosure, the molybdenum metal films deposited directly on a nucleation film disposed directly on a dielectric surface may comprise low electrical resistivity molybdenum metal films. In some embodiments, molybdenum metal films deposited over a dielectric surface utilizing an intermediate nucleation film may have a lower electrical resistivity than molybdenum films deposited directly on a dielectric surface, i.e., without any intermediate nucleation film. For example, in some embodiments, the molybdenum metal films of the current disclosure may have an electrical resistivity of less than 3000 $\mu\Omega$-cm, or less than 1000 $\mu\Omega$-cm, or less than 500 $\mu\Omega$-cm, or less than 200 $\mu\Omega$-cm, or less than 100 $\mu\Omega$-cm, or less than 50 $\mu\Omega$-cm, or less than 25 μΩ-cm, or less than 15 μΩ-cm, or even less than 10 μΩ-cm. As a non-limiting example, a molybdenum metal film may be deposited over a surface of a dielectric material utilizing an intermediate nucleation film to a molybdenum metal film thickness of approximately less than 60 Angstroms and the molybdenum metal film may exhibit an electrical resistivity of less than 40 μΩ-cm, or less than 35 μΩ-cm, or even less than 30 μΩ-cm.

In addition to improving the electrical resistivity of molybdenum metal films, the deposition of an intermediate nucleation film may also improve the surface roughness of the deposited molybdenum metal films. For example, FIG. 6 demonstrates the r.m.s. surface roughness ($R_a$) in Angstroms for two exemplary 60 Angstrom thick molybdenum metal films. The molybdenum metal film denoted by label 600 was deposited directly on an aluminum oxide ($Al_2O_3$) dielectric surface and has a corresponding r.m.s. surface roughness ($R_a$) of approximately 7.3 Angstroms. The molybdenum metal film denoted by label 602 was deposited directly on a 4 Angstrom thick silicon nitride nucleation film disposed directly on an aluminum oxide ($Al_2O_3$) dielectric surface and has a corresponding r.m.s. surface roughness ($R_a$) of approximately 3.3 Angstroms. It should be noted that the r.m.s. surface roughness ($R_a$) of molybdenum metal films may be determined utilizing atomic force microscopy, e.g., over a surface area of 1 micron×1 micron.

Therefore, the use of intermediate nucleation films greatly improves the surface roughness of the molybdenum metal film, for example, in some embodiments, the r.m.s. surface roughness of the molybdenum metal films deposited over a dielectric surface utilizing an intermediate nucleation film may have a r.m.s. surface roughness ($R_a$) of less than 5 Angstroms, or less than 4 Angstroms, or less than 3 Angstroms, or even less than 2 Angstroms. In some embodiments, the r.m.s. surface roughness ($R_a$) may be expressed as the percentage roughness of the total film thickness. For example, in some embodiments the r.m.s. surface roughness ($R_a$) may be less than 10 percent, or less than 5 percent, or less 3 percent, or even less than 1 percent of the total thickness of the molybdenum metal film.

In some embodiments of the disclosure, the methods of depositing a molybdenum metal film over a dielectric surface utilizing an intermediate nucleation film may further comprise depositing a molybdenum metal film with a low atomic percentage (atomic-%) of impurities. For example, the molybdenum metal films of the current disclosure may comprise an impurity concentration of less than 5 atomic-%, or less than 2 atomic-%, or even less than 1 atomic-%. In some embodiments, the impurities disposed within the molybdenum metal film may comprise at least oxygen and chlorine.

The embodiments of the current disclosure may also provide semiconductor device structures including molybdenum metal films. In some embodiments, the semiconductor device structures may comprise: a substrate comprising a dielectric surface; a nucleation film disposed directly on the dielectric surface; and a molybdenum metal film disposed directly on the nucleation film. As non-limiting examples, semiconductor device structure 410 (of FIG. 4C) and semiconductor device structure 510 (of FIG. 5C) comprise a dielectric substrate 402/502, the dielectric substrate comprising a dielectric surface. Disposed directly on the dielectric substrate 402 is a nucleation film 406/506, and disposed directly on the nucleation film 406/506 is a molybdenum metal film 412/512. Therefore, in some embodiments, the nucleation 406/506 is disposed directly between a molybdenum metal film 412/512 and a dielectric material 402/502.

In some embodiments, the nucleation film 406/506 may comprise a continuous film, whereas in alternative embodiments, the nucleation film 4067506' may comprise a discontinuous film. In some embodiments, the continuous nucleation film 406/506 may a thickness of less than 20 Angstroms, or less than 10 Angstroms, or less than 5 Angstroms, or even less than 3 Angstroms. In some embodiments, the discontinuous nucleation film 406'/506' may have a thickness of less than 20 Angstroms, or less than 10 Angstroms, or less than 5 Angstroms, or even less than 3 Angstroms.

In some embodiments, the nucleation film 406/506 may comprise a compound material and in particular embodiments the nucleation film 406/506 may comprise a binary compound material, such as, for example, a silicon binary compound material or a molybdenum binary compound material. In some embodiments, the nucleation film 406/506 may comprise a ternary compound material, such as, for example, a silicon ternary material, or a molybdenum ternary material.

As non-limiting examples, a silicon binary compound material may comprise at least one of a silicon nitride, a silicon carbide, or a silicon oxide. As further non-limiting examples, a molybdenum binary compound material may comprise at least one of a molybdenum nitride, a molybdenum carbide, a molybdenum oxide, or a molybdenum silicide.

In some embodiments, the molybdenum metal films 412/512 may be crystalline and have an impurity concentration of less than 5 atomic-%, or less than 2 atomic-%, or even less than 1 atomic-%. In addition, the molybdenum metal films 412/512 may have an electrical resistivity of less than 40 μΩ-cm at a thickness of less than 60 Angstroms.

In some embodiments, the molybdenum metal films 412/512 may have a r.m.s. surface roughness ($R_a$) of less than 5 Angstroms, or less than 4 Angstroms, or less than 3 Angstroms, or even less than 2 Angstroms. In some embodiments, the r.m.s. surface roughness ($R_a$) may be expressed as the percentage roughness of the total film thickness. For example, in some embodiments the r.m.s. surface roughness ($R_a$) may be less than 10 percent, or less than 5 percent, or less 3 percent, or even less than 1 percent of the total thickness of the molybdenum metal film. The low surface roughness of the molybdenum metal films 412/512 may enable the molybdenum metal films to fill one or more gap features disposed in and or on a substrate, such as vertical gap feature 404 and/or horizontal gap feature 504, without the formation of a seam, as illustrated by molybdenum metal films 412 and 512.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

What is claimed is:

1. A method for depositing a molybdenum metal film over a dielectric surface of a substrate by a cyclical deposition process, the method comprising:
   providing a substrate comprising a dielectric surface into a reaction chamber;
   depositing a nucleation film comprising a silicon compound material directly on the dielectric surface, wherein depositing the nucleation film comprises repeating unit cycles of the cyclical deposition process to form the nucleation film having a thickness of less than 10 Angstroms, wherein at least one of the unit cycles comprises:
      contacting the substrate with a first vapor phase reactant comprising a silicon precursor; and
      contacting the substrate with a second vapor phase reactant comprising at least one of a nitrogen precursor, an oxygen precursor, or a carbon precursor, wherein the nitrogen precursor comprises at least one of ammonia, hydrazine, triazane, tertbutylhydrazine, methylhydrazine, dimethylhydrazine, or a nitrogen plasma, wherein the oxygen precursor comprises at least one of water, hydrogen peroxide, ozone, or an oxide of nitrogen comprising at least one of nitrogen monoxide, nitrous oxide, or nitrogen dioxide, and wherein the carbon precursor comprises a hydrocarbon; and
   depositing a molybdenum metal film directly on the nucleation film, wherein depositing the molybdenum metal film comprises:
      contacting the substrate with a first vapor phase reactant comprising a molybdenum halide precursor; and
      contacting the substrate with a second vapor phase reactant comprising a reducing agent precursor.

2. The method of claim 1, wherein the silicon compound material comprises a silicon binary compound material.

3. The method of claim 2, wherein the silicon binary compound material comprises at least one of a silicon nitride, a silicon carbide, or a silicon oxide.

4. The method of claim 1, wherein the molybdenum metal film has a r.m.s. surface roughness ($R_a$) of less than 5 percent of the total thickness of the molybdenum metal film.

5. The method of claim 1, wherein depositing the molybdenum metal film further comprises heating the substrate to substrate temperature of less than 600° C.

6. The method of claim 1, wherein depositing the molybdenum metal film further comprises heating the substrate to substrate temperature of between 400° C. and 700° C.

7. The method of claim 1, wherein the molybdenum halide precursor comprises a molybdenum chalcogenide halide.

8. The method of claim 7, wherein the molybdenum chalcogenide halide comprises a molybdenum oxyhalide selected from the group comprising: a molybdenum oxychloride, a molybdenum oxyiodide, or a molybdenum oxybromide.

9. The method of claim 8, wherein the molybdenum oxychloride comprises molybdenum (IV) dichloride dioxide ($MoO_2Cl_2$).

10. The method of claim 1, wherein the molybdenum metal film is a crystalline film.

11. The method of claim 1, wherein the dielectric surface comprises a gap feature and the molybdenum metal film fills the gap feature without the formation of a seam.

12. The method of claim 1, wherein the molybdenum halide precursor is selected from the group consisting of a molybdenum chalcogenide halide and a molybdenum oxyhalide.

13. The method of claim 1, wherein the nucleation film is a discontinuous film.

14. The method of claim 1, wherein depositing molybdenum metal film comprises repeating unit cycles of the cyclical deposition process to form the molybdenum metal film having a thickness of between 50 Angstroms and 200 Angstroms.

15. The method of claim 1, wherein providing the substrate comprises providing an engineered substrate, wherein the dielectric surface is disposed over a bulk support with an intervening buried oxide (BOX) layer disposed therebetween.

16. The method of claim 1, wherein the thickness of the nucleation film is less than 5 Angstroms.

17. The method of claim 1, wherein the thickness of the nucleation film is less than 3 Angstroms.

* * * * *